United States Patent
Jones (10) Patent No.: US 10,729,045 B2
(45) Date of Patent: *Jul. 28, 2020

(54) HIGH-PERFORMANCE ELECTROMAGNETIC SHIELDING ASSEMBLIES

(71) Applicant: Raytheon Company, Waltham, MA (US)

(72) Inventor: Daniel P. Jones, Pinellas Park, FL (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/689,005

(22) Filed: Nov. 19, 2019

(65) Prior Publication Data

US 2020/0113094 A1 Apr. 9, 2020

Related U.S. Application Data

(63) Continuation of application No. 15/661,957, filed on Jul. 27, 2017, now Pat. No. 10,485,150.

(Continued)

(51) Int. Cl.
*H05K 9/00* (2006.01)
*G06F 1/16* (2006.01)
(Continued)

(52) U.S. Cl.
CPC ......... *H05K 9/0081* (2013.01); *G06F 1/1656* (2013.01); *H01Q 1/526* (2013.01); *H01Q 21/061* (2013.01)

(58) Field of Classification Search
CPC ........ H01Q 1/526; H01Q 21/061; H01Q 1/38; G06F 1/1656; H05K 9/0081; H05K 9/0009

See application file for complete search history.

(56) References Cited

U.S. PATENT DOCUMENTS 7,819,676 B1 10/2010 Cardoso et al.
7,969,748 B2 6/2011 Niederkorn et al.
(Continued)

FOREIGN PATENT DOCUMENTS

WO WO 2002/069686 A1 9/2002
WO WO 2017/081195 A1 5/2017

OTHER PUBLICATIONS

Babikian et al., Packaging Architecture for Fluidic Components in Microfluidic PCBs, 2016 IEEE 66*th* Electronic Components and Technology Conference, 2016, 7 pages, IEEE, United States.

(Continued)

*Primary Examiner* — Jayprakash N Gandhi
*Assistant Examiner* — Hung Q Dang (57) ABSTRACT

A wireless communication electronic assembly can include a plurality of integrated modules each having a ground plate interfaced to each other and defining a shielding plane. Each ground plate can have a left edge and a right edge opposite each other. A plurality of wireless communication devices can be positioned on one side of the shielding plane, and a plurality of electronic devices can be positioned on the other side of the shielding plane. One or more electromagnetic shielding elements, such as gasket(s), channel strip(s), stamping element(s), etc. can be disposed between the left edge and the right edge of adjacent ground plates to electromagnetically shield the plurality of electronic devices from the plurality of wireless communication devices. The left and right edges can be recessed or offset on one side of the shielding plane. Rows and columns of integrated modules can be interfaced about a plurality of electromagnetic shielding elements. A method of installing and replacing integrated modules of an antenna array.

20 Claims, 4 Drawing Sheets

Related U.S. Application Data (60) Provisional application No. 62/370,420, filed on Aug. 3, 2016.

(51) Int. Cl.
*H01Q 1/52* (2006.01)
*H01Q 21/06* (2006.01)

(56) References Cited

U.S. PATENT DOCUMENTS 10,485,150 B2 * 11/2019 Jones .................. H05K 9/0081
2004/0264155 A1 12/2004 Soule et al.

OTHER PUBLICATIONS

Chambion et al., Tunable Curvature of Large Visible CMOS Image Sensors: Towards New Optical Functions and System Miniaturization, 2016 IEEE 66th Electronic Components and Technology Conference, 2016, 10 pages, IEEE, United States.

Damalerio et al., Biopackaging of Intracranial Pressure Microsystem for Multimodality Neuro Monitoring of Severe Head Injury Patients, 2016 IEEE 66th Electronic Components and Technology Conference, 2016, 6 pages, IEEE, United States.

ETS-Lindgren, Sliding Shielded Door (SSD), http://www.ets-lindgren.com/SSD, 3 pages, Cedar Park, TX.

Gan et al., Integration of Micro-Fabricated Scalar Magnetometer with the Combination of Mx and Mz Techniques, 2016 IEEE 66th Electronic Components and Technology Conference, 2016, 6 pages, IEEE, United States.

Mu et al., Double-Densified Vertically Aligned Carbon Nanotube Bundles for Application in 3D Integration High Aspect Ratio TSV Interconnects, 2016 IEEE 66th Electronic Components and Technology Conference, 2016, 6 pages, IEEE, United States.

Van Zeijl et al., Metallic Nanoparticle Based Interconnect for Heterogeneous 3D Integration, 2016. IEEE 66th Electronic Components and Technology Conference, 2016, 8 pages, IEEE, United States.

Watanabe et al., Highly-Effective Integrated EMI Shields with Graphene and Nanomagnetic Multilayered Composites, 2016 IEEE 66th Electronic Components and Technology Conference, 2016, 8 pages, IEEE, United States.

* cited by examiner

HIGH-PERFORMANCE ELECTROMAGNETIC SHIELDING ASSEMBLIES

RELATED APPLICATIONS

This is a continuation application of U.S. patent application Ser. No. 15/661,957, filed Jul. 27, 2017, entitled, "High-Performance Electromagnetic Shielding Assemblies," which application claims the benefit of U.S. Provisional Application No. 62/370,420, filed Aug. 3, 2016, each of which is incorporated herein by reference in its entirety.

GOVERNMENT LICENSE RIGHTS

This invention was made with government support contract N00024-13-C-5230 awarded by the U.S. Navy. The government has certain rights in the invention.

BACKGROUND

Wireless communication assemblies, such as high-power antennas, typically include a number of "line replaceable units" such as Transmit/Receive Integrated Multichannel Modules (TRIMMs). These TRIMMs may have Concentric Circular Antenna (CCA) arrays and are usually part of an antenna assembly. TRIMMs often need to be removed and reinstalled for testing and maintenance while also providing an electromagnetic interference barrier between the CCAs and electronic devices of the antenna (and other external devices), all while not affecting RF performance of the particular high-power antenna.

Generally, many different electronic assemblies can benefit from electromagnetic interference sealing, whether on the system or subsystem levels.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A wireless communication electronics assembly having high-performance electromagnetic shielding is disclosed. The wireless communication electronics assembly comprises a housing and an electromagnetic shielding assembly coupled to the housing. The electromagnetic shielding assembly comprises a plurality of integrated modules removably coupled to each other. Each integrated module can comprise a ground plate having a first side edge and a second side edge opposite each other; at least one wireless communication device coupled to the ground plate and positioned on one side of the ground plate; at least one electronic device coupled to the ground plate and positioned on the other side of the shielding plane; and at least one electromagnetic shielding gasket coupled to the first side edge, wherein adjacent ground plates are coupled to each other about respective side edges such that the electromagnetic shielding gasket is disposed between the respective side edges, thereby defining a shielding plane, to electromagnetically shield the electronic devices from the wireless communication devices of the plurality of integrated modules.

In some examples, the at least one electromagnetic shielding gasket can comprise a pair of electromagnetic shielding gaskets to form a double-sided double-D shield. In some examples, the left and right edges of the plurality of ground plates can be offset relative to the shielding plane or more specifically another side of the shielding plane. In some examples, the plurality of ground plates collectively can form a substantially planar surface on the side of the shielding plane of the wireless communication devices.

In some examples, a supplemental plurality of ground plates can be arranged along top edges of the plurality of ground plates and further defining the shielding plane. A plurality of supplemental electromagnetic shielding gaskets can be disposed between top edges of the plurality of ground plates and bottom edges of the supplemental plurality of ground plates. The supplemental plurality of ground plates can have the same right and left edge interfaces as the plurality of ground plates.

In some examples, a method of coupling to each other integrated modules of a wireless communication electronics assembly is disclosed. The method comprises coupling a first ground plate of a first integrated module to a wireless communication electronics assembly. The first ground plate can comprise a first side edge supporting at least one electromagnetic shielding gasket. The method can comprise slidably interfacing a second ground plate of a second integrated module to the first ground plate of the first integrated module. The second ground plate can comprise a second side edge slidably interfaced to the first side edge of the first ground plate, and coupled to the at least one electromagnetic shielding gasket, to provide an electromagnetically shield along the first and second ground plates.

In one example, the method comprises slidably removing the second ground plate from the first ground plate, and further comprises re-interfacing the second ground plate to or with the first ground plate.

Figure 1:
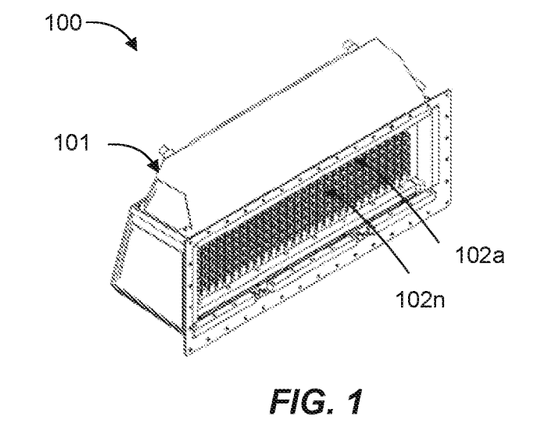
FIG. 1 is an isometric view of a wireless communication electronics assembly in the form of an antenna assembly/array comprising an electromagnetic shielding assembly comprising a plurality of integrated modules in accordance with an example of the present disclosure.
Figure 2:
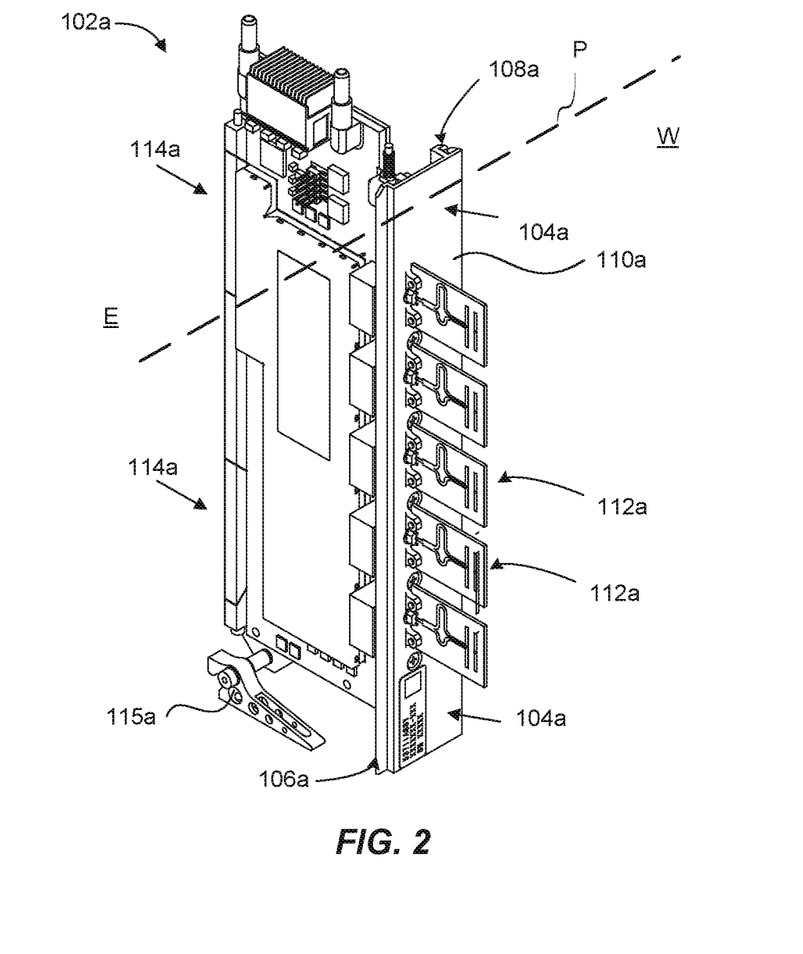
FIG. 2 is an isometric view of an individual integrated module of the antenna assembly/array of FIG. 1 in accordance with an example of the present disclosure.
Figure 3A:
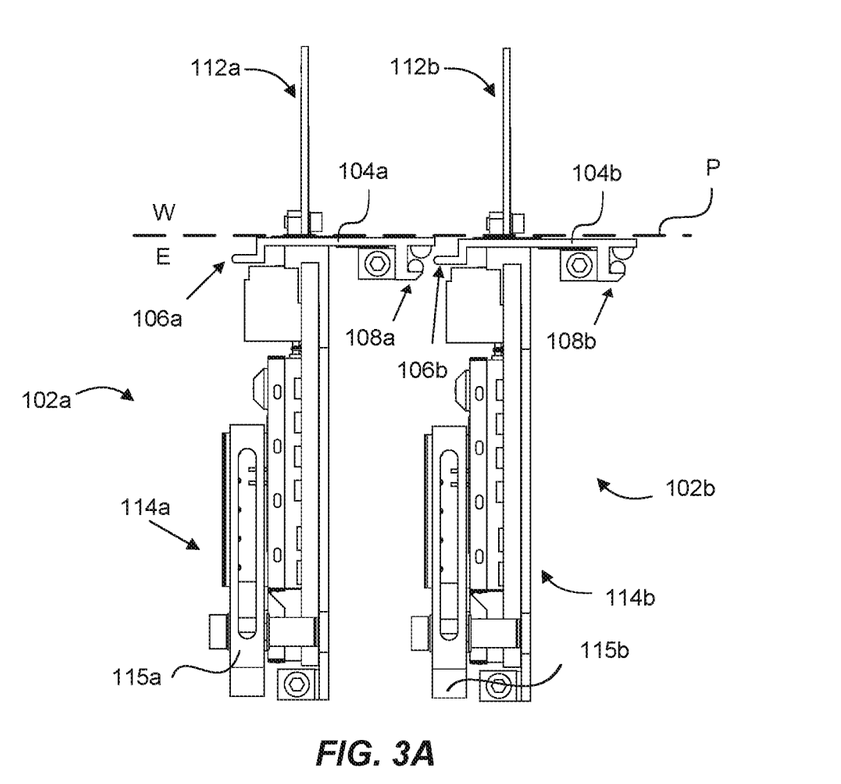
FIG. 3A is a bottom view of a pair of adjacent integrated modules as shown in FIGS. 1 and 2.
Figure 3B:
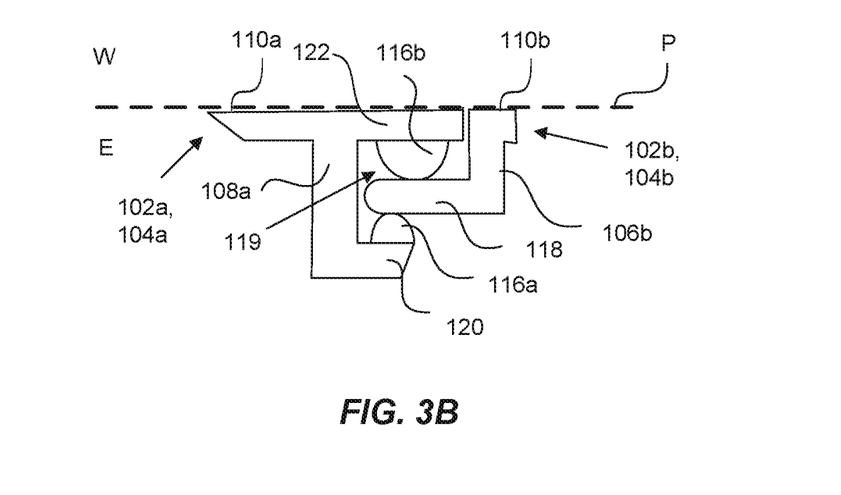
FIG. 3B is an illustration of an edge interface of the pair of adjacent integrated modules of FIG. 3A, these forming an electromagnetic shielding assembly.

FIG. 1 is an isometric view of a wireless communication electronics assembly in the form of an antenna assembly or array 100 comprising an electromagnetic shielding assembly comprising a plurality or an array of integrated modules 102a-n (e.g., TRIMMs) individually interfaced to one another. FIG. 2 is an isometric view of an example integrated module 102a, and FIG. 3A is a bottom view of adjacent integrated modules 102a and 102b (forming a portion of the electromagnetic shielding assembly), and FIG. 3B is a close up view of interfaced edges of the integrated modules FIG. 3A.

With particular reference to FIGS. 1 and 2, the integrated module 102a can include ground plate 104a having a left edge 106a and a right edge 108a opposite each other about a generally planar surface 110a of the ground plate 104a. In one example, the left edge 106a can be formed generally as a male coupling member, and the right edge 108a can be formed generally as a female coupling member (e.g., see FIGS. 3A and 3B). Each edge 106a and 108a can extend along the entire elongated length of the ground plate 104a, or each edge 106a and 108a can extend along a portion of the length of the ground plate 104a.

A plurality of wireless communication devices 112a (e.g., edge radiating aperture CCAs) can be supported by (e.g., fastened or otherwise secured to) the ground plate 104a, and positioned on one side W of the ground plate 104a. A plurality of electronic devices 114a can be coupled to the ground plate 104a, and positioned on the other side E of the ground plate 104a (see also FIG. 3A). The wireless communication devices 112a can be CCAs or other electronic devices, and the electronic devices 114a can be any number of active devices, passive devices, circuit boards, integrated devices, heatsinks, capacitors, etc. that are used to assist with operation of the integrated module, for instance.

The integrated module 102a can comprise an attachment lever 115a that is actuatable by a user to secure the integrated module 102a to a housing 101 of the antenna assembly 100, and to remove the integrated module 102a when desired. As further discussed below, after the integrated module 102a is slidably inserted into the housing 101 and positioned about or next to an adjacent integrated module, the lever 115a can be rotated/moved to a locked position to secure the integrated module 102a to the housing 101 in its operating position. The lever 115a can be a cam-type mechanism that interfaces with or engages a portion of the housing to lock the integrated module 102a in place, or it can be another suitable locking mechanism that facilitates locking and unlocking of a particular integrated module to the housing 101. When being inserted and when in proper operating position, the integrated module 102a is caused to interface with the adjacent integrated module. Conversely, when the integrated module 102a requires testing or repair or replacement, the attachment lever 115a can be rotated/moved to an unlocked position to facilitate removal of the integrated module 102a from the adjacent integrated module, and ultimately removable from the antenna assembly 100. This can be similar for any of the integrated modules 102a-n within the assembly 100. In this manner, a lower panel of the housing 101 can be removed or opened to allow a user to access a lower inside area of the antenna assembly 100, which exposes the various attachment levers (e.g., 115a) of the row of integrated modules 102a-n for a user to lock or unlock into place.

With continued reference to FIGS. 1 and 2, and particular reference to FIGS. 3A and 3B, when adjacent integrated modules 102a and 102b are interfaced to each other along respective edges 108a and 106b, the adjacent ground plates 104a and 104b can define a shielding plane P, as illustrated by the dashed line. The shielding plane P represents an electromagnetic interference (EMI) barrier (or EMI region/area) or ground plane that protects the electronic devices 114a and 114b (on side E) from electromagnetic interference imparted by the wireless communication devices 112a and 112b (on the side W). Note that the wireless communication devices 112a and 112b extend outwardly from respective ground plates 104a and 104b, and are parallel to each other (FIG. 3A). And, a particular column of wireless devices 112a can be vertically aligned relative to each other along ground plate 104a, for instance (FIG. 2). The wireless communication devices can be arranged closer together in this manner due to the increased EMI shielding performance discussed herein, thereby facilitating a compact assembly with maximized power density emitted from the wireless communication devices compared to similar existing assemblies or systems, as further discussed below.

More specifically, the right edge 108a of the integrated module 102a can support or comprise one or more electromagnetic shielding elements, such as a pair of electromagnetic shielding gaskets 116a and 116b. In one example, the gaskets 116a and 116b may be fabric-over-foam EMI gaskets. The right edge 108a can be generally formed as a female edge coupling having a channel or groove 119 made up of at least first and second surfaces defining an area that receives or supports the pair of gaskets 116a and 116b, and that also receives the edge 106b of the integrated module 102b between the gaskets 116a and 116b. The groove 119 can extend longitudinally along the length of the right edge 180a of the ground plate 104a. Each gasket 116a and 116b can be coupled (e.g., adhered or otherwise secured) to opposing first and second inner surfaces of the female type coupling of the right edge 108a, as shown in FIG. 3B. The gaskets 116a and 116b receive (e.g., sandwich) the left edge 106b of the adjacent ground plate 104b (e.g., FIG. 3A) of the integrated module 102b, such that the gaskets 116a and 116b tend to pinch or compress the left edge 106b. In one example, the left edge 106b can be vertically, slidably interfaced to the right edge 108a between the gaskets 116a and 116b, either from above or below the ground plate 104a (once ground plate 104a is coupled to the housing 101 of the antenna assembly 100). Note that the ground plates 104a and 104b if FIG. 3A are shown as un-coupled or not interfaced to each other for purposes of illustration clarity. Reference can be made to FIG. 3B for an illustration of the properly interfaced ground plates 104a and 104b of adjacent integrated modules 102a and 102b.

When the ground plates 104a and 104b are interfaced to or with each other as shown in FIG. 3B, gasket 116a is disposed between a first surface of the male rib 118 of the left edge 106b and a first surface of a female flange portion 120 of the right edge 108a. Similarly, the opposing gasket 116b is disposed between a second surface of the male rib 118 and a second surface of the female portion 122 of the right edge 108a. As such, the right and left edges 108a and 106b of adjacent ground plates 104a and 104b, respectively, are spatially separated from each other about the pair of gaskets 116a and 116b.

Stated differently, the adjacent ground plates do not directly contact each other. Rather, adjacent ground plates are maintained in a spatially separated position relative to one another and tend to float relative to one another by virtue of the pair of gaskets 116a and 116b that facilitate the slidable interface coupling of adjacent ground plates, and that function to maintain separation of the ground plates 104a and 104b about this interface.

In one example, the male rib 118 can extend longitudinally along the length of the left edge 106b. This length can correspond to a distance of the length of the groove 119 of the right edge 108a of the ground plate 104a, or can comprise some other length. In another aspect, the male rib 118 can be segmented, with the individual segments interfacing with the groove 119 of the right edge 108a. Each gasket 116a and 116b can be a D-shaped gasket (a gasket comprising a "D" shaped cross-section taken along a plane orthogonal to a longitudinal axis of the gasket) that is coupled to respective surfaces of the right edge 108a and along the flat edge of the "D" shaped profile of each gasket 116a and 116. Thus, the curved or protruding portion of the D-shaped gaskets can be caused to extend or protrude outwardly to slidably receive and engage the male rib 118 of the left edge 106b to provide a EMI shielding interface. Such configuration of these dual gaskets 116a and 116b shown in FIG. 3B forms a double-sided, dual-D electromagnetic shield between ground plates 104a and 104b of adjacent integrated modules 102a and 102b. The "D" shaped configuration of the gaskets 116a and 116b is not intended to be limiting in any way. Those skilled in the art will recognize that other shapes, profiles, and/or configurations are possible that can also provide an effective electromagnetic shielding interface between adjacent ground plates of adjacent integrated modules. These can include, but are not limited to, double "D" shaped gaskets, "J" shaped gaskets, knife shaped gaskets, square, triangular rectangular, rounded rectangular shaped gaskets, and others, including any of these types having a hollow configuration. Other types of electromagnetic shielding elements are contemplated, such as channel strips, stamping, "D" or other shaped gaskets supported about a clip that could clip to an edge of the integrated modules, and others. Those skilled in the art will also recognize that the gasket(s) or other type(s) of electromagnetic shielding elements can be positioned about any one or both of adjacent integrated modules.

In some examples, only one gasket can be utilized between the right edge 108a and the left edge 106b, such as a C-fold gasket, channel strip, etc. For instance, a single strip fabric-over-foam C-fold type of gasket can be disposed in the channel 119, and then the left edge 106b can be press-fit or slidably engaged to said gasket, whether the gasket is disposed on one side of the male rib 118, or whether the gasket wraps around the tip of the male rib 118, for instance.

In one example, the right edge 108a and the left edge 106b, respectively, of adjacent ground plates 104a and 104b can be recessed about side E and below the shielding plane P. In this context, "recessed" can mean that the right edge 108a and the left edge 106b are offset from the shielding plane P about side E (away from side W), such that there are no features and/or protrusions (i.e., 108a, 106b, 116a, 116b) extending into side W. In other words, when interfaced, the ground plates 104a and 104b generally form a linear, planar surface that extends along all of the interfaced ground plates (e.g., along the line representing shielding plane P), and that is gapless (or nearly or substantially gapless). This means that at least a portion of the ground plates 104a and 104b may be in direct contact such that no gap exists through which radio waves can enter, for instance. It can also mean that a very small gap may exist between the ground plates 104a and 104b, as on FIG. 3B, so that some radio waves are able to pass through the shielding plane P, but which will ultimately be blocked from passage beyond the ground plates due to the aforementioned tortuous path such waves must travel that is provided by the electromagnetic shielding assembly. In any event, this gapless (or nearly or substantially gapless) configuration is advantageous because, any features extending from such collective planar surface, and disposed on the other side W (on the side having wireless communication devices), can interfere with the signals of the wireless communication devices 112a and 112b, which can be highly undesirable for proper performance of the wireless communication devices 112a and 112b and of the electronic devices 114a and 114b. Therefore, such "recessed" or offset right and left edges 108a and 106b, and the defined planar surfaces 110a and 110b of the interfaced ground plates 104a and 104b, collectively provide a planar, substantially continuous surface along the interfaced integrated modules (e.g., 102a-102n, for instance) to shield electronic devices from interfering signals or frequencies emitted by the wireless communication devices 112a-112n.

Note that the shielding plane P is illustrated as a planar line; however, those skilled in the art will appreciate that, in practice, the shielding plane P could be a region or area extending along the interfaced left and right edges of adjacent ground plates near the respective gaskets. On that note, the generally 90 degree extension and offset formation of the male rib 118 (relative to and recessed or offset from planar surface 110b), and the generally 90 degree extension and offset formation of the female portion 120 and the channel formed therein (relative to and recessed or offset from planar surface 110a), further assist to impede or block electromagnetic energy. This is because, in order to pass from one side W to the other side E, such electromagnetic energy must attempt to travel or turn 90 degrees a total of four times (through the male/female structural interface), and also attempt to pass through/beyond the pair of gaskets 116a and 116b. This can be a tortuous and difficult path for electromagnetic energy to travel, therefore this interface can provide an electromagnetic seal between adjacent TRIMMs, for instance, all while providing a line replaceable unit (LRU) system to slidably interface/couple (and slidably remove) such TRIMMs (or other LRU types).

Furthermore, the aforementioned functionality of removing a particular integrated module, then testing it and re-inserting it into the antenna assembly (or replacing it with a new integrated module), provides repeatable EMI shielding effectiveness because of the repeatable and/or interchangeable slidable interfacing of each integrated module along the side edges and dual "D" shaped gaskets. Existing gaskets associated with existing antenna arrays tend to break apart or fall out when removing and replacing various components of the antenna. In the present examples, each integrated module can be individually removed and replaced without affecting the EMI shielding effectiveness of the collective ground plates and EMI gaskets. Thus, each integrated module (e.g., TRIMM) can be an LRU that also provides an EMI barrier while not affecting the RF performance of the antenna aperture.

Moreover, the slidable interfacing of adjacent integrated modules can be achieved with small forces that partially elastically deform or distort the gasket(s) as a particular integrated module is being inserted, thus ensuring a proper and effective shielding interface between the gaskets and the integrated modules. This helps to prevent damage to sensitive electrical components, and assists with repeatability and longevity of a particular integrated module, and ultimately of the antenna assembly.

While an example of one particular shielding interface configuration is described above and shown in the drawings (the male and female edge configurations as specifically shown in FIG. 3B of the drawings), this is not intended to be limiting in any way. Indeed, it will be apparent to those skilled in the art upon reading the disclosure herein that other interfacing edge configurations are possible that provide a similar shielding plane having recessed or offset interfacing features. For example, the structural edge configuration making up the male and female edges of adjacent integrated modules could be formed on angles other than 90 degrees, such as on 45 degrees. This configuration would likely provide similar effective electromagnetic shielding capabilities as the configuration in FIG. 3B. In another example, the interfacing edge configuration can comprise a serpentine-type having one or more EMI gaskets between edges. In such example, the male rib 118 can have a curve linear shape, while the female flange portion 120 can also have a corresponding curve linear shape, with one or more gaskets disposed therebetween. In another example, the male rib 118 and the female flange portion 120 can be formed 90 degrees clockwise from the view of FIG. 3B, whereby the male rib 118 is formed perpendicular to the generally planar surface 110a. Moreover, a snapping or locking interface could be used. While not listing them all, still others are possible and are contemplated herein. Indeed, upon reading the disclosure of the technology as set forth herein, those skilled in the art will recognize still other coupling or interfacing configurations that could be used while maintaining the spirit of the invention. In any event, the recessed or offset configurations discussed herein can be configured to provide effective EMI shielding, while also providing a mechanism to couple and decouple adjacent TRIMMs, for instance.

Advantageously, interfaced integrated modules as disclosed herein can provide a compact antenna assembly configuration because the wireless communication devices (e.g., CCAs) can be stacked relatively closely together to form the entire array of the antenna assembly, all while providing appropriate EMI shielding as discussed herein. When desiring greater or maximum power density from the CCAs, for instance, greater EMI shielding performance can be provided. Thus, there is a direct correlation between the maximum power density possible (e.g., the number of CCAs) and the level of EMI shielding performance utilized within a particular system. Because each integrated module is slidably interfaced to adjacent integrated modules in parallel and with at least one EMI gasket between adjacent integrated modules, the EMI shielding capabilities are relatively high (e.g., 85 dB or more). Compare this "parallel" configuration to the "in-plane" configuration of existing systems where the wireless communication devices are arranged in-plane with each other, which decreases the space and amount of CCAs that can be incorporated into an antenna array, comparatively speaking.

Therefore, and advantageously, more CCAs can be incorporated into the assemblies disclosed herein because this "increased EMI shielding performance" accounts for the higher power density resulting from the increased number of CCAs. As a result, each wireless communication device (e.g., 112a, 112b) can be disposed closer together (e.g., about 0.9 inches apart, or less), and can be arranged parallel to each other along adjacent ground plates, and vertically aligned relative to each other along a given ground plate.

Depending on the system, the LRUs and EMI gaskets and the shielding interface between adjacent integrated modules as discussed herein could provide either primary or secondary EMI shielding for a target system or subsystem. For instance, the wireless communications electronics assembly, and particularly the wireless communication devices, could comprise a cover operable to provide primary EMI shielding when the cover is in place. In this instance, the EMI gaskets or other electromagnetic shielding elements, along with the shielding interface, could provide secondary EMI shielding. When one or more of the covers are removed, such as to obtain access to the individual integrated modules, the electromagnetic shielding interface technology described herein could provide secondary EMI shielding.

Figures 4A, 4B, 4C:
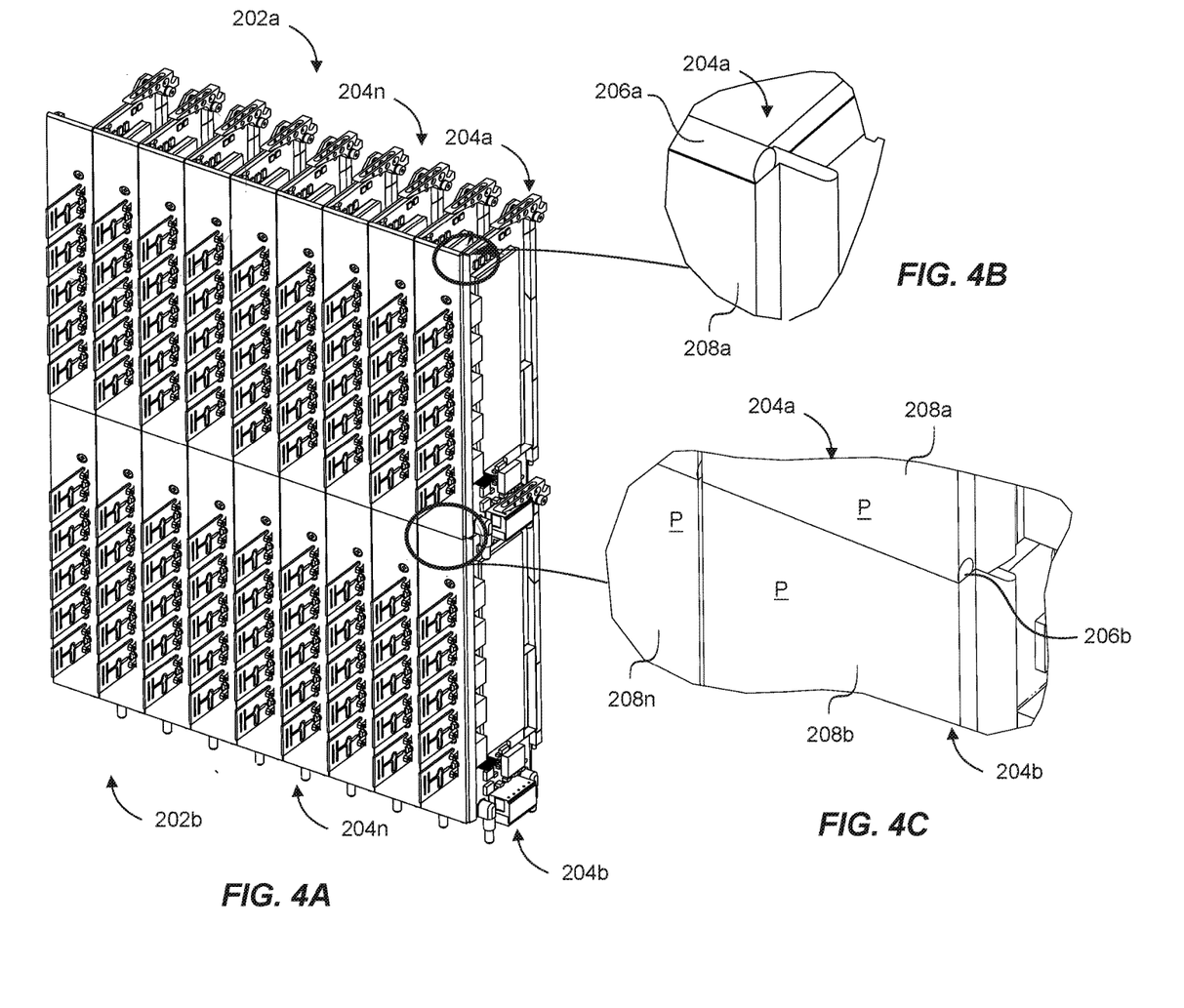
FIG. 4A is an isometric view of a first or an upper row of integrated modules stacked on a second or a lower row of supplemental integrated modules of an antenna assembly/array in accordance with an example of the present disclosure.
FIG. 4B is a detailed partial isometric view of the indicated upper portion of the antenna assembly/array of FIG. 4A.
FIG. 4C is a detailed partial isometric view of the indicated interface between the upper and lower rows of integrated modules of FIG. 4A.

FIG. 4A shows a plurality of integrated modules comprising a first or upper row 202a of upper integrated modules 204a-n coupled to a second or lower row 202b of lower integrated modules 204b-n, thus forming an array, which can be coupled to a housing of an antenna assembly/array (e.g., FIG. 1) in accordance with an example of the present disclosure. Note that the integrated modules of FIG. 4A are shown inverted as compared to those shown in FIG. 2, for purposes of illustration of the gaskets of FIGS. 4A-4C. Further note that the terms "upper" and "lower" are used for purposes of referencing the drawings, and should not connote any particular orientation of integrated modules and/or an antenna assembly/array.

With reference to FIGS. 4A-4C, the upper and lower (or first and second) rows of integrated modules 204a-n can each have side edge interfacing structures configured similar to those of the integrated modules described above. That is, side edges of adjacent integrated modules of the first row 202a and likewise, side edges of adjacent integrated modules of the second row 202b, can be interfaced together, such as one at a time sequentially. Thus, the first row 202a and the second row 202b can function together to define a shielding plane along the generally planar surface of the collective ground plates 208a-n of each of the integrated modules 204a-n across upper and lower rows 202a and 202b (along the array of integrated modules).

Notably, an electromagnetic shielding gasket 206b can be disposed between a bottom edge of the ground plate 208a of the upper integrated module 204a and the top edge of the ground plate 208b of the lower integrated module 204b, as exemplified in FIG. 4C. The electromagnetic shielding gasket 206b can be a single strip extending along the lateral length of the ground plates 208a and 208b between upper and lower ground plates 208a and 208b, or the gasket 206b can be an individual gasket coupled between adjacent upper and lower ground plates 208a and 208b (as in the example shown in FIG. 4C). As exemplified in FIG. 4B, a particular single gasket 206a can be coupled or otherwise secured to the top edge of the ground plate 208a, so that when the integrated module 204a is slidably interfaced to an adjacent/lateral integrated module, the gasket 206a is sandwiched or biased between the top edge of the ground plate 208a and a bottom edge of an upper ground plate of an upper integrated module (not shown). This final coupling interface is shown in FIG. 4C, where the gasket 206b could be coupled (e.g., adhered or otherwise secured) to the top edge of the ground plate 208b, so that when the integrated module 204b is slidably interfaced to an adjacent/lateral integrated module along the bottom row 202b, the gasket 206b would be sandwiched or biased between ground plates 208a and 208b of upper and lower integrated modules 204a and 204b, respectively. This configuration provides EMI shielding along the x-y planes of the collective ground plates 208a-n of the upper and lower (or first and second) rows 202a and 202b of the integrated modules 204a-n.

In one example, the gasket 206b can be recessed or offset relative to planar surfaces of the ground plates 208a and 208b, for instance, such as described above with reference to FIGS. 1-3B. In this manner, the gasket 206b can be coupled (e.g., adhered) to the top edge of the ground plate 208b and can comprise an O-shape or D-shaped profile. And, the bottom edge of the ground plate 208a can comprise a recessed channel that receives a portion of the gasket 206b. Thus, when the integrated module 204b is slidably, vertically interfaced to an adjacent/lateral integrated module (e.g., slid-in from below) of the lower row 202b, the gasket 206b on top of the ground plate 208b of the integrated module 204b can be received in the corresponding recessed channel of the ground plate 208a of the integrated module 204a of the upper row 202a. Thus, no portion of the gasket 206b would extend or protrude beyond the generally planar surfaces of the adjacent ground plates 208a-n, which further assists to provide an effective EMI barrier between either side of the rows and columns (the array) of interfaced ground plates 208a-n of the antennae assembly.

Figure 5:
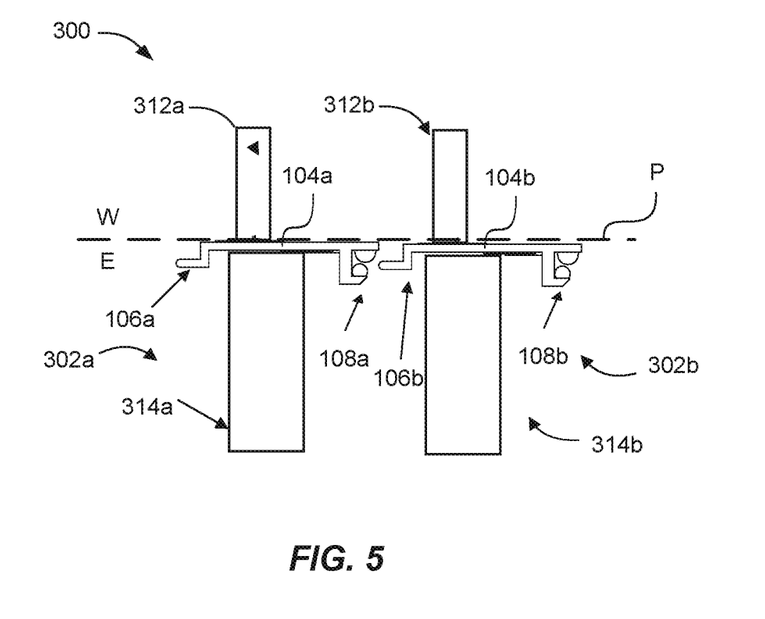
FIG. 5 is a bottom view of a pair of adjacent integrated modules, similar to FIG. 3A, in accordance with an example of the present disclosure.

Although the above discussion focuses on a wireless communication electronics assembly in the form of an antenna assembly, it is contemplated that the shielding technology described herein can be applicable to other wireless communications electronics assembly types. With reference to FIG. 5, illustrated is an example generic electromagnetic shielding assembly 300 that comprises adjacent integrated modules 302a and 302b interfaced to each other along respective edges 108a and 106b (edge 108a being opposite edge 106a of integrated module 302a, and edge 106b being opposite edge 108b of integrated module 302b). The adjacent ground plates 104a and 104b can be configured as described above with respect to FIGS. 3A and 3B, and can define a shielding plane P, as illustrated by the dashed line. As taught above, the shielding plane P represents an electromagnetic interference (EMI) barrier (or EMI region/area) or ground plane that protects electronic devices 314a and 314b (on side E) from electromagnetic interference imparted by the wireless communication devices 312a and 312b (on the side W).

Notably, FIG. 5 illustrates that the ground plate interface configuration disclosed herein (e.g., FIG. 3B) can be implemented in many different assemblies, subassemblies, systems, etc. As such, an antennae assembly is not intended to be limiting in any way. Generally speaking, at least one wireless communication device 312a (e.g., any device capable of receiving and/or transmitting a signal) can be coupled (or otherwise secured or disposed) to the ground plate 104a on side W, while at least one electronic device 314a can be coupled (or otherwise secured or disposed) to the ground plate 104a on side E. Likewise, at least one wireless communication device 312b (e.g., any device capable of receiving and/or transmitting a signal) can be coupled (or otherwise secured or disposed) to the ground plate 104b on side W, while at least one electronic device 314b can be coupled (or otherwise secured or disposed) to the ground plate 104b on side E. For instance, the wireless communication devices 312a and 313b can be those associated with a signal-transmitting device or system, such as radios (AM/FM), computers, televisions, jammers (e.g., those used in military applications), and the like.

The examples described herein can provide greater than 85 dB of isolation at the edge interface between adjacent ground plates (whether at the vertical or horizontal interfaces discussed herein). Of course, those skilled in the art will recognize that other values can be achieved depending upon the configuration and overall design of the assembly. For example, the dB of isolation can be dependent upon the materials used, the configuration of the electromagnetic shielding assembly, the number of wireless communication devices used, the configuration and makeup of the shielding gasket(s), etc., and as such, this is only intended as an example. Indeed, with other configurations of the wireless communications electronics assembly the isolation at the edge interface could be as high as 120 dB (or more). In one example, this can be achieved by changing the materials used, such as by using certain metals for ground plates that exhibit certain EMI shielding capabilities, or by selecting EMI gasket material that has increased silver therein, thereby increasing the amount of EMI shielding capabilities. Moreover, using a fabric-over-foam core EMI gasket ensures long-term reliability and repeatability of sliding shield performance. This is desirable when a single, individual integrated module requires removal, testing, and/or replacement (or re-insertion), for example. Individual removability is advantageous because it prevents the requirement for a user to remove the entire antenna array in order to test or replace a single integrated module.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An integrated module operable to interface with a second like-integrated module to form, at least in part, an electromagnetic shielding assembly of an electronics assembly, the integrated module comprising:
   a ground plate having a first side edge, a second side edge and a surface portion extending between the first side edge and the second side edge, the ground plate defining, at least in part, a shielding plane;
   at least one wireless communication device supported by the ground plate and positioned on a first side of the surface portion of the ground plate;

at least one electronic device supported by the ground plate and positioned on a second side of the surface portion of the ground plate; and at least one electromagnetic shielding element supported by at least one of the first side edge or the second side edge, wherein the shielding plane facilitates, at least in part, an electromagnetic interference barrier operable to shield the at least one electronic device from electromagnetic interference imparted by the at least one wireless communication device.

2. The integrated module of claim 1, wherein the surface portion of the ground plate comprises a planar surface portion operable to define, at least in part, the shielding plane.

3. The integrated module of claim 1, wherein the integrated module is operable to interface with an adjacent like-integrated module, such that adjacent ground plates of the integrated module and the adjacent integrated module are coupled to each other about respective side edges, such that the electromagnetic shielding element is disposed between the respective side edges, the adjacent ground plates defining, at least in part, the shielding plane.

4. The integrated module of claim 1, wherein the at least one wireless communication device comprises a plurality of wireless communication devices supported on the first side of the surface portion of the ground plate.

5. The integrated module of claim 1, wherein the at least one electronic device comprises a plurality of electronic devices supported on the second side of the surface portion of the ground plate.

6. The integrated module of claim 1, wherein the electromagnetic shielding element comprises an elastically deformable electromagnetic shielding gasket.

7. The integrated module of claim 1, wherein the first and second side edges of the ground plate are offset relative to the second side of the surface portion of the ground plate and the shielding plane.

8. The integrated module of claim 1, wherein the first and second side edges each comprise a first extension segment that extends away from the second side of the surface portion of the ground plate, and a second extension segment that extends in a direction away from the first segment.

9. The integrated module of claim 1, wherein the first and second extension segments are linear.

10. The integrated module of claim 1, wherein the first and second extension segments are curved.

11. The integrated module of claim 1, further comprising an attachment lever operable to facilitate the selective securing and release of the integrated module to a housing and any adjacent like-integrated modules.

12. The integrated module of claim 11, wherein the attachment lever comprises a cam-type mechanism that facilitates locking and unlocking of the integrated module to the housing.

13. The integrated module of claim 1, wherein the second side edge of the ground plate comprises;
a coupling configuration operable to interface with and receive a side edge of an adjacent integrated module having a mating edge configuration; and
at least one electromagnetic shielding element supported about different direction facing surfaces of the second side edge of the ground plate.

14. The integrated module of claim 13, wherein, upon coupling the integrated module and the adjacent integrated module together, the at least one electromagnetic shielding element supported about the second side edge of the ground plate of the integrated module receive the side edge of the adjacent integrated module, such that the side edge of the adjacent integrated module is spatially and physically separated from the second side edge of the ground plate of the integrated module.

15. The integrated module of claim 1, wherein the second side edge of the ground plate is configured as a channel, with the at least one electromagnetic shielding element comprising multiple electromagnetic shielding elements supported about opposing surfaces of the channel to facilitate formation of a double-sided, dual electromagnetic shield.

16. The integrated module of claim 15, wherein the channel extends longitudinally at least partially along the length of the second side edge of the ground plate.

17. The integrated module of claim 15, wherein the surface portion of the ground plate comprises an extension segment that forms part of the channel.

18. The integrated module of claim 1, wherein the first side edge of the ground plate comprises a rib.

19. The integrated module of claim 18, wherein the rib extends at least partially longitudinally along the length of the first side edge of the ground plate.

20. The integrated module of claim 1, wherein the at least one electromagnetic shielding element comprises a deformable electromagnetic shielding gasket.

* * * * *